(12) United States Patent
Majima

(10) Patent No.: US 8,378,638 B2
(45) Date of Patent: Feb. 19, 2013

(54) BATTERY STATUS DETECTING METHOD AND BATTERY STATUS DETECTING APPARATUS

(75) Inventor: Yoshihide Majima, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 704 days.

(21) Appl. No.: 12/081,438

(22) Filed: Apr. 16, 2008

(65) Prior Publication Data

US 2009/0033292 A1 Feb. 5, 2009

(30) Foreign Application Priority Data

Jul. 30, 2007 (JP) ................................. 2007-197863

(51) Int. Cl.
*H02J 7/04* (2006.01)
(52) U.S. Cl. ......... 320/153; 320/132; 320/142; 320/162
(58) Field of Classification Search .................... 320/153
See application file for complete search history.

(56) References Cited

U.S. PATENT DOCUMENTS

| | | | | |
|---|---|---|---|---|
| 5,352,968 A * | 10/1994 | Reni et al. | ...................... | 320/136 |
| 6,127,806 A | 10/2000 | Tanjo et al. | | |
| 6,404,163 B1 * | 6/2002 | Kapsokavathis et al. | ..... | 320/104 |
| 6,495,989 B1 | 12/2002 | Eguchi | | |
| 6,789,026 B2 | 9/2004 | Barsoukov et al. | | |
| 6,832,171 B2 | 12/2004 | Barsoukov et al. | | |
| 6,892,148 B2 | 5/2005 | Barsoukov et al. | | |
| 2003/0006822 A1* | 1/2003 | Murakami et al. | ............ | 327/513 |
| 2006/0186890 A1* | 8/2006 | Iwane et al. | .................. | 324/426 |

FOREIGN PATENT DOCUMENTS

| | | |
|---|---|---|
| JP | 11-326472 | 11/1999 |
| JP | 2001-051029 | 2/2001 |
| JP | 2001-057246 | 2/2001 |
| JP | 2001-231179 | 8/2001 |
| JP | 2002-243813 | 8/2002 |
| JP | 2004-32871 | 1/2004 |
| JP | 2005-321295 | 11/2005 |
| WO | WO 2006/096002 A1 | 9/2006 |

OTHER PUBLICATIONS

Japanese Office Action dated Aug. 4, 2009 with partial translation.
Japanese Office Action dated Aug. 3, 2010.
Extended European Search Report mailed Dec. 29, 2010.

* cited by examiner

*Primary Examiner* — Edward Tso
*Assistant Examiner* — Johali Torres Ruiz
(74) *Attorney, Agent, or Firm* — IPUSA, PLLC

(57) ABSTRACT

A battery status detecting method for detecting a battery status of a secondary battery is disclosed. The method includes: an open circuit voltage correcting step of obtaining a temperature-corrected value of the open circuit voltage of the secondary battery according to the temperature of the secondary battery, based on first open circuit voltage characteristics indicating the relationship between the open circuit voltage and the temperature of the secondary battery; and a charge rate correcting step of obtaining a temperature-corrected value of the charge rate of the secondary battery according to the temperature-corrected value of the open circuit voltage obtained in the open circuit voltage correcting step, based on second open circuit voltage characteristics indicating the relationship between the open circuit voltage and the charge rate of the secondary battery.

7 Claims, 7 Drawing Sheets

US 8,378,638 B2

BATTERY STATUS DETECTING METHOD AND BATTERY STATUS DETECTING APPARATUS

BACKGROUND OF THE INVENTION

1. Field of the Invention

The present invention relates to a battery status detecting method and a battery status detecting apparatus for detecting the status of a secondary battery.

2. Description of the Related Art

Open circuit voltage characteristics of a secondary battery indicating a relationship between the charge rate and the open circuit voltage of a secondary battery is conventionally assumed to be substantially constant regardless of degradation or changes in the usage conditions of the secondary battery. For example, Japanese Laid-Open Patent Publication No. 2001-231179 discloses a battery capacity detecting method using such open circuit voltage characteristics. Specifically, the disclosed battery capacity detecting method involves measuring the open circuit voltage during a rest period of a secondary battery and estimating the charge rate of the secondary battery at the time of the measurement based on the measured open circuit voltage and the open circuit voltage characteristics of the secondary battery obtained beforehand. It is noted that the above publication further discloses a method of estimating the full charge capacity of the secondary battery based on the charge rates of the secondary battery before and after performing battery charging operations and the amount of power charged to the secondary battery during the battery charging operations, and a method of estimating the remaining capacity of the secondary battery after completion of the battery charging operations based on the charge rate after performing the battery charging operations and the full charge capacity.

However, there are secondary batteries that have open circuit voltages with temperature characteristics. Accordingly, when the battery status such as the charge rate of a secondary battery is detected based on open circuit voltage characteristics represented by a curve with the vertical axis indicating the open circuit voltage and the horizontal axis indicating the charge rate, detection errors of the charge rate may vary even when detection errors of the open circuit voltage are the same. Specifically, detection errors of the charge rate may be greater in the case where the open circuit voltage characteristics of the secondary battery are represented by a curve having a relatively gentle slope compared to a case where the open circuit voltage characteristics of the secondary battery are represented by a curve having a relatively steep slope. Thus, it is desirable that the temperature characteristics of the open circuit voltage of the secondary battery be taken into consideration in detecting the battery status, such as the charge rate of the secondary battery.

SUMMARY OF THE INVENTION

An aspect of the present invention is directed to providing a battery status detecting method and a battery status detecting apparatus for accurately detecting a battery status by taking temperature characteristics into consideration.

According to one embodiment of the present invention, a battery status detecting method for detecting a battery status of a secondary battery is provided, the method including:

an open circuit voltage correcting step of obtaining a temperature-corrected value of the open circuit voltage of the secondary battery according to the temperature of the secondary battery based on first open circuit voltage characteristics indicating a relationship between the open circuit voltage and the temperature of the secondary battery; and a charge rate correcting step of obtaining a temperature-corrected value of the charge rate of the secondary battery according to the temperature-corrected value of the open circuit voltage obtained in the open circuit voltage correcting step based on second open circuit voltage characteristics indicating a relationship between the open circuit voltage and the charge rate of the secondary battery.

According to another embodiment of the present invention, a battery status detecting apparatus that detects a battery status of a secondary battery is provided that includes:

a correction unit that corrects the charge rate of the secondary battery according to the temperature of the secondary battery based on first open circuit voltage characteristics indicating a relationship between the open circuit voltage and the temperature of the secondary battery and second open circuit voltage characteristics indicating a relationship between the open circuit voltage and the charge rate of the secondary battery.

DETAILED DESCRIPTION OF THE PREFERRED EMBODIMENTS

In the following, preferred embodiments of the present invention are described with reference to the accompanying drawings.

Figure 1:
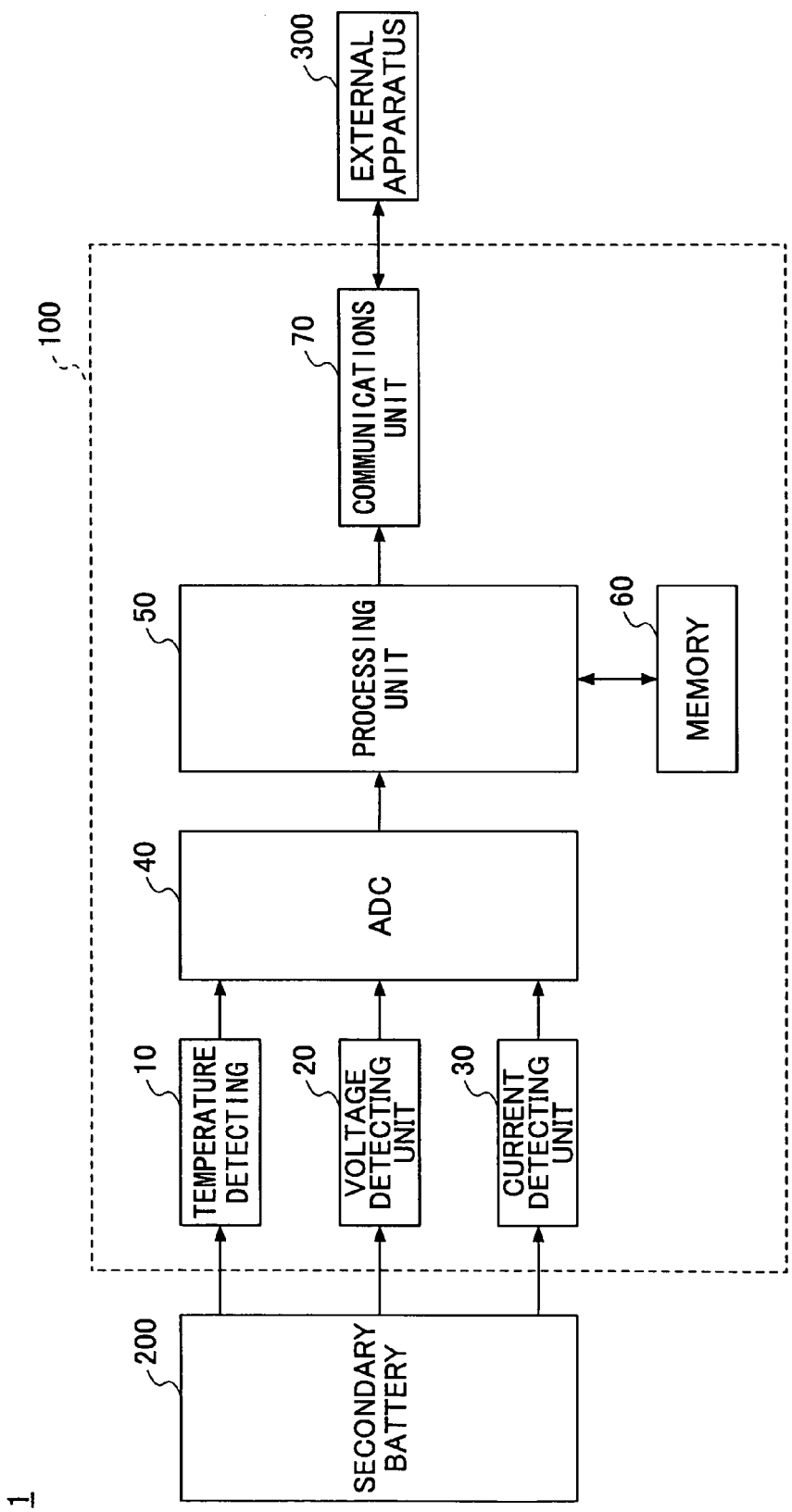
FIG. 1 is a block diagram showing a configuration of a system using a battery status detecting apparatus according to an embodiment of the present invention.

FIG. 1 is a block diagram showing a configuration of a system 1 that uses a battery status detecting apparatus 100 according to an embodiment of the present invention. The illustrated battery detecting apparatus 100 includes a temperature detecting unit 10 that measures the temperature of a secondary battery 200 such as an electric double layer capacitor; a voltage detecting unit 20 that measures the voltage of the secondary battery 200; a current detecting unit 30 that measures the charging/discharging current of the secondary battery 200; an analog-to-digital converter (ADC) 40 that converts analog voltage values representing detection results output from the above detecting units into digital values; a processing unit 50 such as a microcomputer that performs computational processes such as, for example, current integration, capacity correction, or a dischargeable capacity calculation; a memory 60 such as an EEPROM or a flash memory that stores characteristics data for determining characteristics of the secondary battery 200 or the battery status detecting apparatus 100 that are used in executing the above processes; and a communications unit 70 such as a communications IC that transmits battery status information of the secondary battery 200 to an external apparatus 300 that uses the secondary battery 200 as a power source. It is noted that in one embodiment, the temperature detecting unit 10, the voltage detecting unit 20, the current detecting unit 30, the ADC 40, and the processing unit 50 may be packaged into an integrated circuit.

The temperature detecting unit 10 measures the temperature of the secondary battery 200, converts the measured temperature into a battery temperature indicating voltage that may be input to the ADC 40. The battery temperature indicating voltage is then converted by the ADC 40 into a battery temperature digital value indicating the temperature of the secondary battery 200, and the converted battery temperature digital value is conveyed to the processing unit 50 to be used as a parameter for computational processing. Also, the battery temperature digital value is converted into units pre-designated by the processing unit 50 and the converted battery temperature digital value is output to the external apparatus 300 via the communications unit 70 as battery status information indicating the battery status of the secondary battery 200. It is noted that a temperature measuring unit according to an embodiment of the present invention that obtains a measurement value of the temperature of a secondary battery may be embodied by the temperature detecting unit 10 and the ADC 40, for example. The temperature of the secondary battery detected by the temperature detecting unit 10 may include the temperature of the secondary battery itself and the ambient temperature of the secondary battery. In a case where the secondary battery 200 and the battery status detecting apparatus 100 are located close to each other, the ambient temperature detected by the temperature detecting unit 10 may include the temperature of the battery status detecting apparatus 100 and its component units, for example. Also, in the case where the temperature detecting unit 10 is arranged within an integrated circuit packaged together with the voltage detecting unit 20, the current detecting unit 30, and the ADC 40, the temperature detecting unit 10 may detect the temperature of the integrated circuit itself or the ambient temperature thereof, for example.

The voltage detecting unit 20 measures the voltage of the secondary battery 200 and converts the measured battery voltage into a battery voltage indicating voltage that may be input to the ADC 40. The converted battery voltage indicating voltage is then converted by the ADC 40 into a battery voltage digital value indicating the voltage of the secondary battery 200, and the converted battery voltage digital value is conveyed to the processing unit 50 to be used as a parameter for computational processing. Also, the battery voltage digital value is converted into units pre-designated by the processing unit 50, and the converted battery voltage digital value is output to the external apparatus 300 via the communications unit 70 as battery status information indicating the battery status of the secondary battery 200. It is noted that the voltage detecting unit 20 and the ADC 40 may correspond to a status measuring unit according to an embodiment of the present invention that obtains a measurement value of a status of a secondary voltage.

The current detecting unit 30 measures the charging/discharging current of the secondary battery 200 and converts the measured charging/discharging current into a current indicating voltage that may be input to the ADC 40. Specifically, the current detecting unit 30 may include a current detecting resistor that is serially connected to the secondary battery 200 and an operational amplifier that amplifies voltages generated at two ends of the current detecting resistor, and the detected charging/discharging current may be converted into the current indicating voltage by the current detecting resistor and the operational amplifier. It is noted that the operational amplifier may alternatively be provided at the ADC 40. The converted current indicating voltage is then output to be converted by the ADC 40 into a battery current digital value indicating the charging/discharging current of the secondary battery 200, and the converted battery current digital value is conveyed to the processing unit 50 to be used as a parameter for computational processing. Also, the battery voltage digital value is converted into units pre-designated by the processing unit 50, and the converted battery voltage digital value is output to the external apparatus 300 via the communications unit 70 as battery status information indicating the battery status of the secondary battery 200.

The processing unit 50 is capable of calculating the amount of electricity being charged to or discharged from the secondary battery 200 by performing integration on the current value detected by the current detecting unit 30 while the secondary battery 200 is being charged or discharged (e.g., a certain amount of current exceeding a predetermined value is being consumed by operations of the external apparatus 300). The processing unit 50 is also capable of calculating the amount of electricity currently stored in the secondary battery 200 (remaining capacity). It is noted that Japanese Laid-Open Patent Publication No. 2004-226393 discloses a concept relevant to calculation of the remaining capacity of a secondary battery. According to the disclosed concept, when the charging/discharging characteristics of a secondary battery change in response to changes in the charging/discharging conditions, such as the temperature or the current of the secondary battery, the change is not regarded as a change in charging/discharging efficiency, but rather, a temporary change in the amount of electricity that cannot be charged/discharged. In other words, a certain amount of electricity that cannot be charged/discharged exists in the secondary battery, and this amount changes depending on the charging/discharging conditions. According to this concept, a correction process does not have to be performed with respect to the charging/discharging efficiency. However, when a temperature dependent circuit exists within the battery status detecting apparatus 100, the processing unit 50 may be configured to correct the charging/discharging current value of the secondary battery 200 that is digitally converted by the ADC 40 based on charging/discharging current-temperature characteristics and the temperature detected by the temperature detecting unit 10. It is noted that the charging/discharging current-temperature characteristics may be represented by a correction table or a correction function, for example. In this case, data included in the correction table or the coefficients of the correction function may be stored in the memory 60 as characteristics data. In turn, the processing unit 50 may correct the charging/discharging current value according to the temperature detected by the temperature detecting unit 10 based on the correction table or correction function representing the characteristics data read from the memory 60. It is noted that a correction unit according to an embodiment of the present invention that corrects a battery status of the secondary battery according to the temperature of the secondary battery may be embodied by the processing unit 50 and various programs and coefficient/table data read from the memory 60 to be used in the computation processes executed by the processing unit 50, for example.

In a case where a large number of errors are included in measurements made by the current detecting unit 30 or the current detecting unit 30 is unable to perform measurement operations over a certain time period owing to the fact that charging/discharging operations of the secondary battery 200 are in rest mode (e.g., when operations of the external apparatus 300 is at rest or in standby mode), if the above-described current integration process for calculating the remaining capacity is continually performed during this time period, errors may be integrated in the process so that the accuracy of the calculated remaining capacity may be degraded. In order to prevent such accuracy degradation, the processing unit 50 may be configured to stop the current value integration process in such a case, or the consumption current value of the external apparatus 300 may be detected beforehand and stored in the memory 60, for example.

However, even when the current value integration process is stopped during rest mode or a pre-detected consumption current value is used in the integration process, errors cannot be prevented from being included in the integration results obtained by the integration process because the actual consumption current value cannot be reflected in the integration process. Accordingly, in a preferred embodiment, when the external apparatus 300 remains in rest mode for over a predetermined time period, the processing unit 50 is configured to periodically detect the voltage (open circuit voltage) of the secondary battery 200 and calculate/correct the charge rate based on open circuit voltage-charge rate characteristics shown in FIG. 2. It is noted that open circuit voltage refers to an interpolar voltage detected when the secondary battery 200 is stable and their terminals are open or maintain a high impedance status (such a status including a low load status substantially equivalent to an open status). The charge rate is a value indicating the percentage of the remaining capacity of the secondary battery 200 with respect to the full charge capacity of the secondary battery 200. The open circuit voltage-charge rate characteristics may be expressed by a correction table or a correction function, for example. In such a case, data of the correction table or coefficients of the correction function may be stored in the memory 60 as characteristics data. Accordingly, the processing unit 50 refers to the correction table or correction function reflecting the characteristics data read from the memory 60 to calculate/correct the charge rate of the secondary battery 200 according to the open circuit voltage measured by the voltage detecting unit 20.

As can be appreciated from the above descriptions, the processing unit 50 is capable of calculating the charge rate of the secondary battery. It is noted that, because the remaining capacity of the secondary battery 200 is calculated based on the relationship between the full charge capacity and charge rate of the secondary battery 200, the remaining capacity of the secondary battery 200 cannot be calculated unless the full charge capacity of the secondary battery 200 is measured or estimated.

The full charge capacity of the secondary battery 200 may be calculated based on the amount of power discharged by the secondary battery 200 or the amount of power charged to the secondary battery 200, for example. In the case where a charging method other than pulse charging is used, the secondary battery 200 is charged with a constant voltage or a constant current so that the charge current may be more accurately measured. Thus, calculation based on the amount of charged power may be preferably used in such a case compared to a calculation based on the amount of discharged power which is prone to be influenced by the current consumption characteristics of the external apparatus 300. However, the method for calculating the full charge capacity of the secondary battery 200 is not limited to a particular method and one or both of the above methods may be suitably selected for use depending on the characteristics of the external apparatus 300, for example.

In order to obtain accurate measurement of the full charge capacity of a battery, the battery has to be continually charged from the time the power capacity of the battery is zero until the time at which the battery is fully charged. Specifically, the current value of currents accumulated during this charging period corresponds to the full charge capacity. However, it is noted that under normal circumstances, a battery is rarely charged in the manner described above. That is, a battery is usually charged while it still has a certain amount of energy remaining within.

Accordingly, in the present embodiment, the processing unit 50 is configured to calculate the full charge capacity of the secondary battery 200 based on the battery voltage right before starting charging operations and the battery voltage at the time a predetermined time elapses from the time charging operations of the secondary battery 200 are ended. Specifically, the processing unit 50 calculates the charge rate of the secondary battery 200 right before charging operations are started based on the open circuit voltage of the secondary battery 200 right before the charging operations are started and the open circuit voltage-charge rate characteristics of the secondary battery 200 shown in FIG. 2, and additionally, the processing unit 50 calculates the charge rate of the secondary battery 200 after a predetermined time elapses from the end of the charging operations based on the open circuit voltage of the secondary battery 200 after the predetermined time elapses from the end of the charging operations and the open circuit voltage-charge rate characteristics of the secondary battery 200 shown in FIG. 2. Provided that the full charge capacity of the secondary battery 200 is denoted by FCC [mAh], the charge rate right before the charging operations are started is denoted by SOC1 [%], the charge rate after the predetermined time elapses from the end of the charging operations is denoted by SOC2 [%], and the amount of electricity charged during the charge period from the start to the end of the charging operations is denoted by Q [mAh], the processing unit 50 calculates the full charge capacity FCC of the secondary battery 200 based on the following formula (1):

$$FCC=Q/\{(SOC2-SOC1)/100\}$$

In one preferred embodiment, the values of SOC1 and SOC2 may be temperature-corrected in order to realize more accurate calculation. Also, it is noted that the battery voltage after a predetermined time elapses from the end time of the charging operations is preferably used as the value of SOC2 as opposed to the battery voltage right after the charging operations because the battery voltage may be more stabilized after the predetermined time elapses and such a stabilized battery voltage may be reflected in the calculation to obtain a more accurate calculation result.

According to the present embodiment, the remaining capacity of the secondary battery 200 may be calculated based on the charge rate and the full charge capacity of the secondary battery 200 calculated in the above-described manner (i.e., remaining capacity=full charge capacity× charge rate).

It is noted that by enabling calculation of the full charge capacity FCC of the secondary battery 200, the degree of degradation SOH [%] of the secondary battery 200 may be estimated. Specifically, provided that the initial full charge capacity of the secondary battery 200 is denoted by AFCC, and the full charge capacity of the secondary battery 200 at a given point in time is denoted by RFCC, the processing unit 50 may calculate the degree of degradation SOH at a given point in time based on the following formula (2):

$$SOH = RFCC/AFCC \times 100$$

However, in the case where the component units of the battery status detection apparatus 100 or the secondary battery 200 have temperature characteristics, even when the current integration, the charge rate calculation, and the full charge capacity calculation are performed in the above-described manner, errors may occur due to the temperature characteristics and accurate calculation results may not be obtained, for example.

Figure 2:
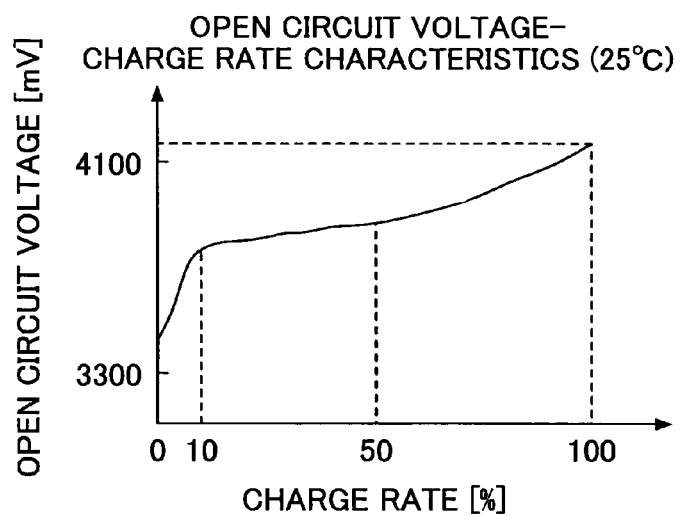
FIG. 2 is a graph showing open circuit voltage-charge rate characteristics of a secondary battery at 25° C.
Figure 3:
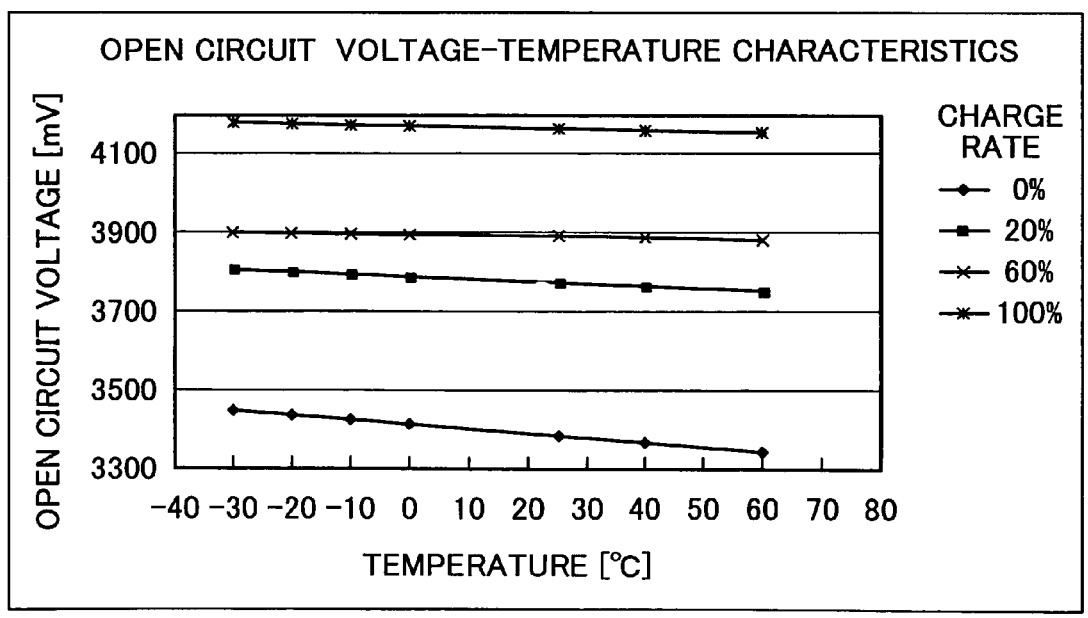
FIG. 3 is a graph showing open circuit voltage-temperature characteristics of the secondary battery.

FIG. 3 is a graph indicating open circuit voltage-temperature characteristics of the secondary battery 200. As is shown in FIG. 3, the open circuit voltage of the second battery 200 tends to decrease as the temperature of the second battery 200 increases. It is noted that FIG. 2 indicates the open circuit voltage-charge rate characteristics of the secondary battery 200 at 25° C. When the charge rate of the secondary battery 200 is calculated only based on the open circuit voltage-charge rate characteristics shown in FIG. 2, errors may occur depending on the current temperature of the secondary battery 200.

Also, it is noted that the battery status detecting apparatus 100 may also have one or more temperature dependent circuit units as its component units. Specifically, since the temperature detecting unit 10, the voltage detecting unit 20, the current detecting unit 30, and the ADC 40 may include analog elements such as resistors, transistors, and amplifiers, for example, one or more of these component units may correspond to temperature dependent circuit units. In the case where the above component units are arranged into an integrated circuit, although temperature dependence of elements within the wafer of the integrated circuit are properly considered at the design stage, the integrated circuit may still have slightly varying characteristics depending on the temperature due to variations in the manufacturing process or variations in the in-plane characteristics of the wafer, for example.

Figure 4:
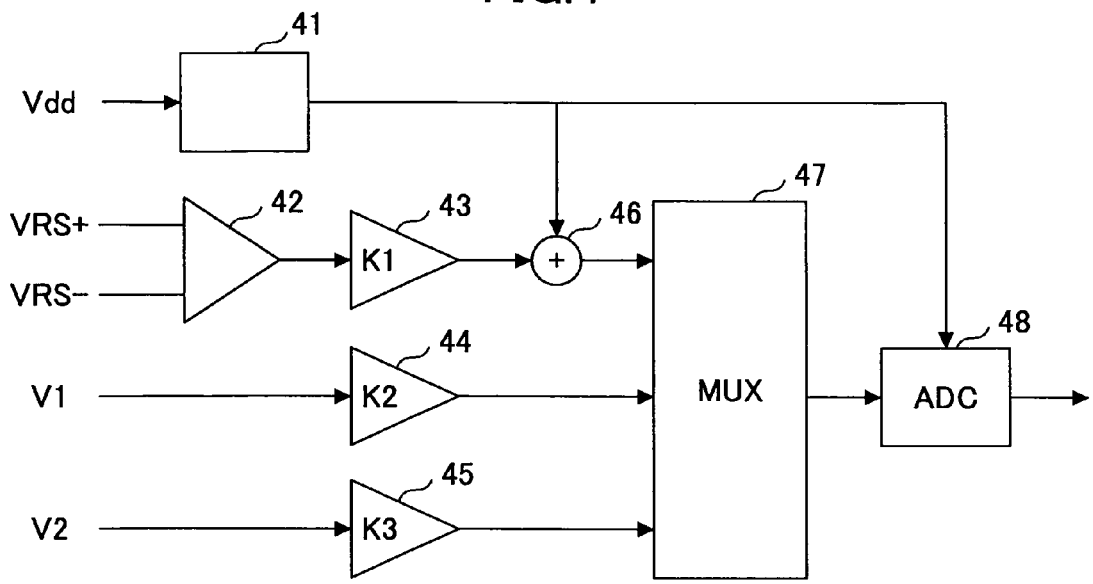
FIG. 4 is a circuit diagram showing a configuration of an analog-to-digital converter (ADC) of the battery status detecting apparatus.

FIG. 4 is a circuit diagram showing an exemplary configuration of the ADC 40. In this example, the ADC 40 is a temperature dependent circuit unit that includes analog devices such as resistors and transistors that have temperature characteristics. Specifically, the ADC 40 includes: analog circuits, such as a reference voltage generating circuit 41 that generates a reference voltage Vref for the circuits within the ADC 40 from an external power source Vdd; an operational amplifier 42 that amplifies a voltage generated at the terminals of a current detecting resistor of the current detecting unit 30; an amplifier circuit 43 that amplifies an input signal from the current detection unit 30 supplied via the operational amplifier 42; an amplifier circuit 44 that amplifies an input signal from the temperature detecting unit 10; an amplifier circuit 45 that amplifies an input signal from the voltage detecting unit 20; a multiplexer circuit 47 that selectively outputs the outputs of the amplifier circuits 43-45; and an ADC circuit 48 that converts an analog value to a digital value.

Figure 5:
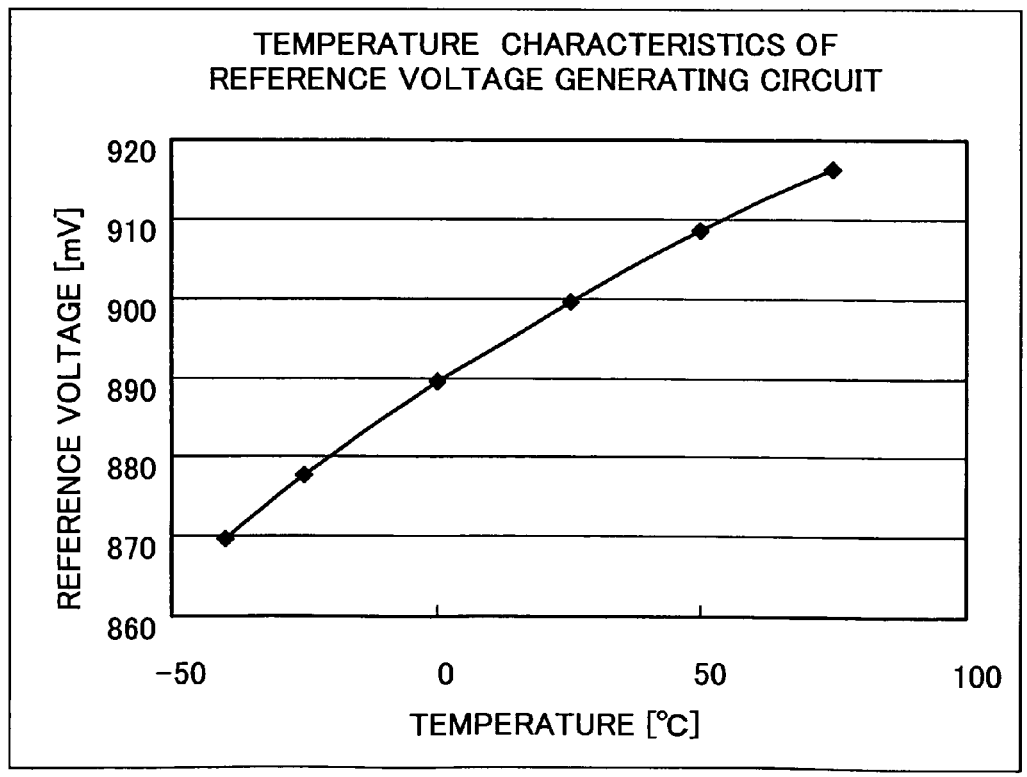
FIG. 5 is a graph showing temperature characteristics of the ADC.
Figure 6:
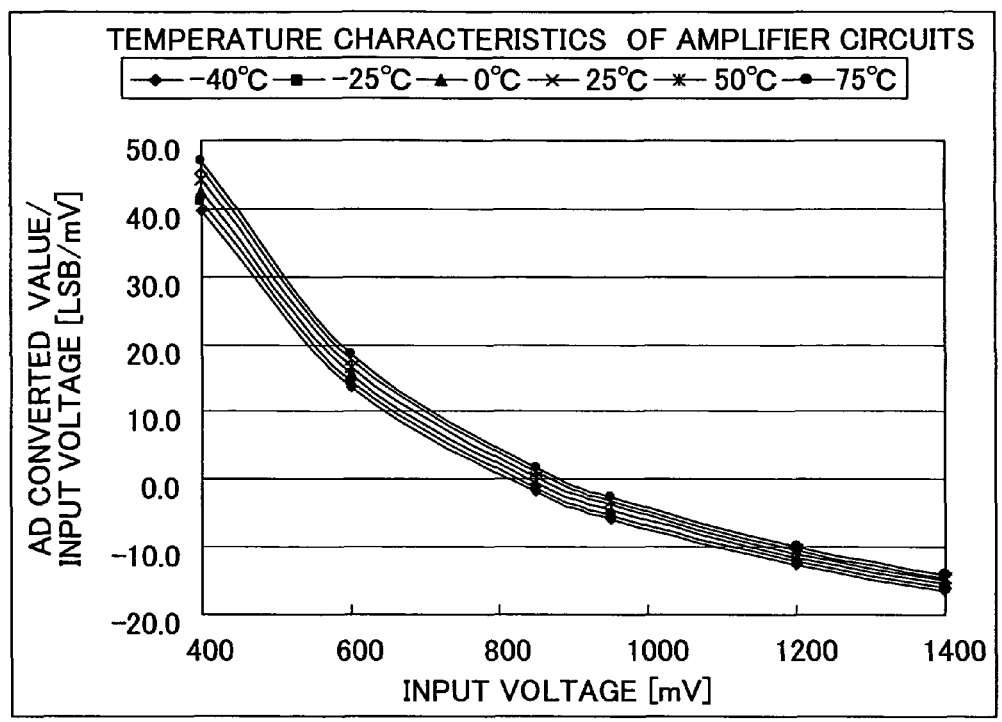
FIG. 6 is a graph showing temperature characteristics of amplifier circuits of the battery status detecting apparatus.

FIG. 5 is a graph showing temperature characteristics of the reference voltage generating circuit 41, and FIG. 6 is a graph showing temperature characteristics of the amplifier circuits 45, 46, and 47 as representative temperature characteristics of the above-described analog circuits. Specifically, FIG. 5 shows the temperature characteristics of the reference voltage generating circuit 41 that generates a reference voltage Vref of 900 mV at a reference temperature of 25° C. where the reference voltage Vref increases as the temperature increases. FIG. 6 shows the temperature characteristics of the amplifier circuits 45, 46, and 47 where the ADC converted value output increases with respect to an input voltage as the temperature increases.

It is noted that variations in the reference voltage Vref cause variations in the offset of the ADC converted value, and variations in the amplifier circuit 45, 46, and 47 cause variations in the gain. The processing unit 50 uses the temperature characteristics shown in FIGS. 5 and 6 to cancel out these variations to thereby reduce detection errors in detecting the battery status of the secondary battery 200. The temperature characteristics shown in FIGS. 5 and 6 may be represented by a correction table or a correction function, for example. In this case, data contained in the correction table or coefficients of the correction function may be stored in the memory 60 as characteristics data. In turn, the processing unit 50 may refer to the correction table or the correction function reflecting the characteristics data of FIGS. 5 and 6 to perform temperature correction on the reference voltage of the reference voltage generating circuit 41 or the output voltage of the amplifier circuits 45, 46, and 47 according to the temperature detected by the temperature detecting unit 10.

As for the method of performing temperature correction, a correction computation process may be performed on each component element (e.g., reference voltage generating circuit 41, and amplifier circuits 45, 46, and 47) of a temperature dependent circuit unit. Alternatively, provided that required precision criteria can be met, the temperature dependent circuit unit may be regarded as one circuit and temperature characteristics of the respective component elements of the temperature dependent circuit unit may be compiled to obtain temperature characteristics of the temperature dependent circuit as a whole, for example. In this case, temperature correction may be performed on the temperature dependent circuit as a whole based on the compiled temperature characteristics.

Figure 7:
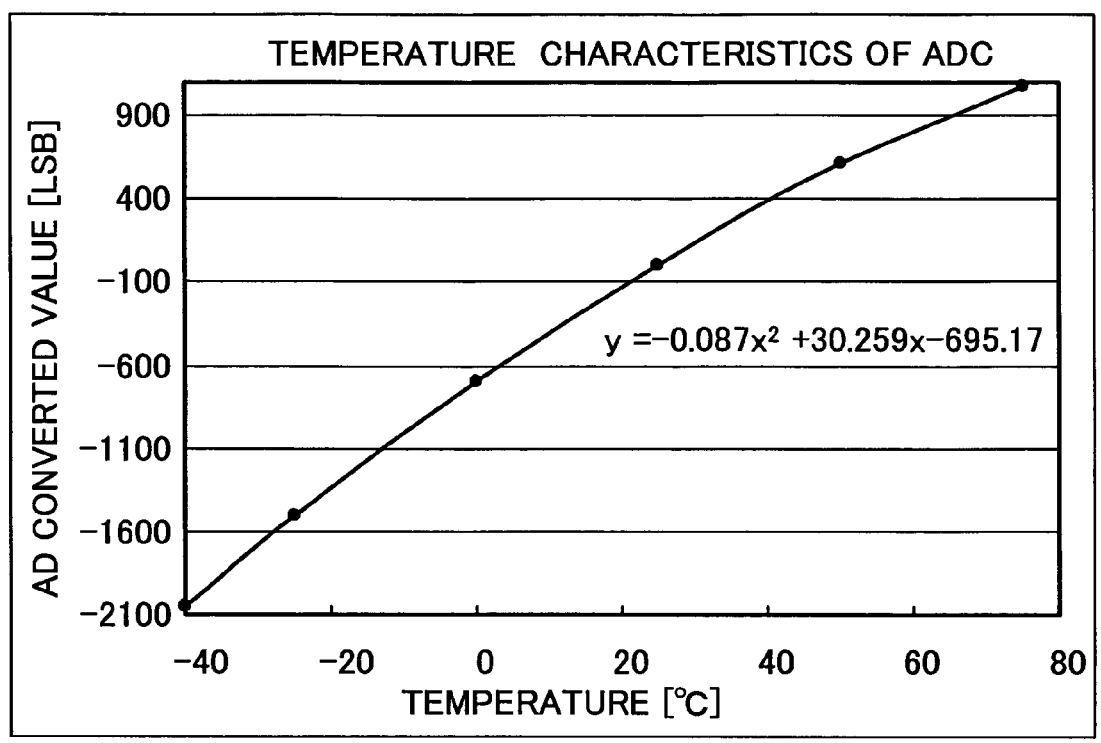
FIG. 7 is a graph showing test result data representing temperature characteristics of an ADC value (output value) of the ADC in a case where devices from the input side to the output side of the ADC are regarded as one temperature dependent circuit unit.

FIG. 7 is a graph showing test result data representing temperature characteristics of the ADC converted value (output value) in a case where devices from the analog input side to the digital output side of the ADC 40 are regarded as one temperature dependent circuit unit. Specifically, FIG. 7 shows the amount of variation (offset) of an ADC converted value obtained at a given temperature with respect to a reference ADC converted value obtained at a reference temperature of 25° C. in a case where a predetermined input voltage is input to the ADC 40. It is noted that the ADC converted value may be a constant value if the ADC 40 does not have temperature characteristics. However, due to the temperature characteristics of the ADC 40 shown in FIG. 7, the ADC converted value increases as the temperature increases.

The temperature characteristics of the ADC 40 shown in FIG. 7 may be represented by an approximated curve with the temperature as a variable, for example. Specifically, based on the profile of the graph shown in FIG. 7, a model function for representing the temperature characteristics of the ADC 40 may be expressed by the following quadratic formula (3):

$$y = A \cdot x^2 + B \cdot x + C$$

In the above formula (3), y denotes the ADC converted value, x denotes the temperature, and A, B, and C denote coefficients. By calculating the coefficients A, B, and C, the temperature characteristics of the ADC 40 may be unambiguously represented by the above formula (3). In one preferred embodiment, a curve fitting process may be performed to calculate the coefficients A, B, and C of the formula (3). It is noted that curve fitting refers to a mathematical method for obtaining a curve (regression curve) that fits a set of data values. According to this method, a model function is provided beforehand, and parameters determining the profile of the model function are statistically estimated. For example, the method of least squares may be implemented in the curve fitting process. To calculate the coefficients of the formula (3) through a curve fitting process, numerical analysis software such as MATLAB or LabVIEW may be used. In the exemplary case of FIG. 7, the following values are calculated as the coefficients of formula (3): A=−0.087, B=30.259, C=−695.17. Accordingly, the calculated values of the coefficients A, B, and C may be stored in the memory 60 so that the processing unit 50 may calculate the offset amount of the ADC converted value of the ADC 40 at a current temperature according to formula (3) based on the values of the coefficients A, B, and C read from the memory 60 and the temperature detected by the temperature detecting unit 10. It is noted that gain error correction may be performed in a similar manner using the above-described method, for example.

In the following, temperature correction processes performed by the processing unit 50 are described with reference to FIGS. 8 and 9.

Figure 8:
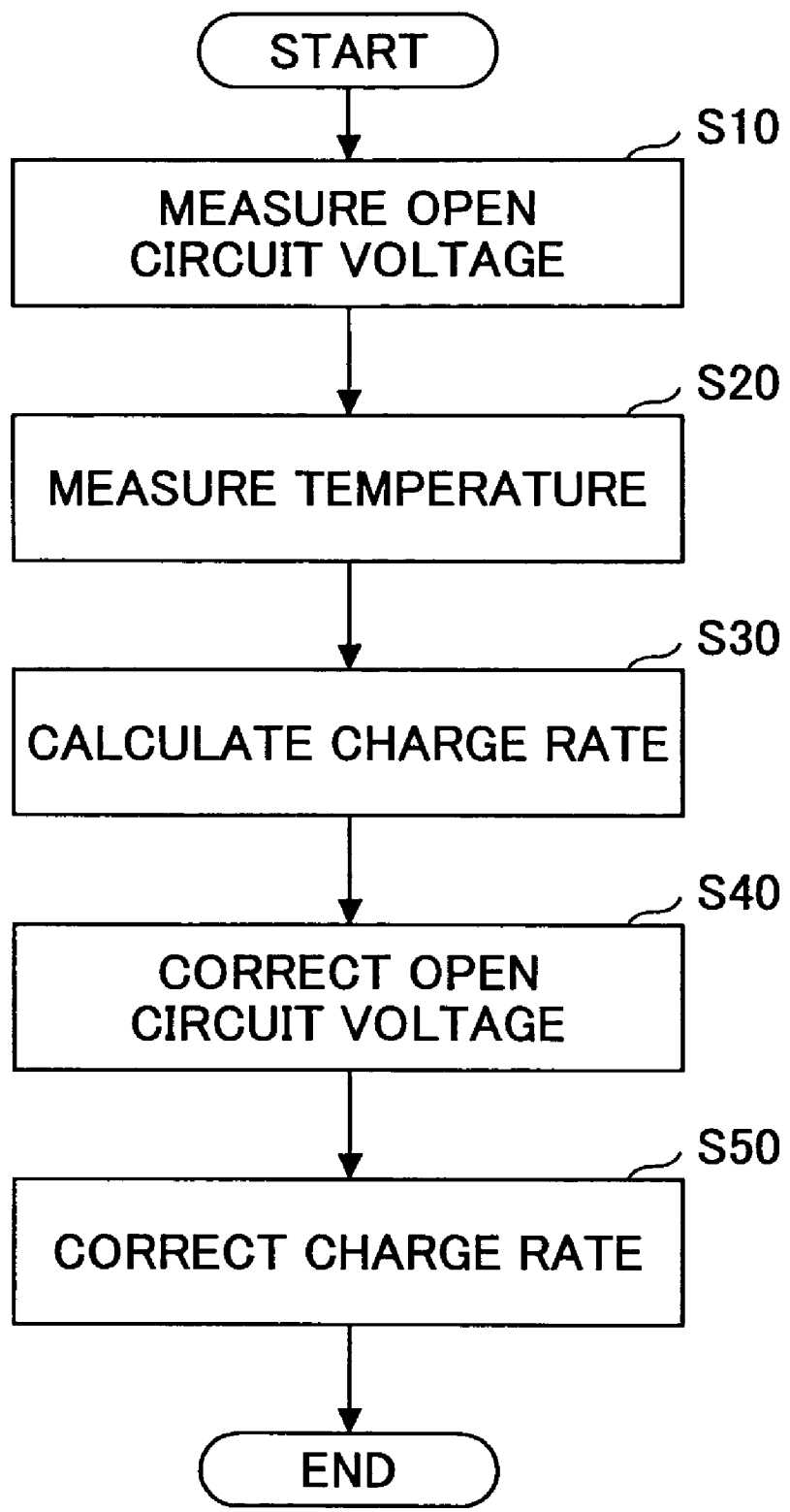
FIG. 8 is a flowchart showing process steps of a correction process for calculating/correcting the charge rate of the secondary battery taking into consideration the temperature characteristics of the open circuit voltage of the secondary battery.

FIG. 8 is a flowchart showing process steps of a correction process for calculating/correcting the charge rate of the secondary battery taking into consideration the temperature characteristics of the open circuit voltage of the secondary battery 200. In this case, the processing unit 50 calculates/corrects the charge rate by correcting the open circuit voltage measured by the voltage detecting unit 20 according to the temperature measured by the temperature detecting unit 10 based on the open circuit voltage-charge rate characteristics shown in FIG. 2 and the open circuit voltage-temperature characteristics shown in FIG. 3.

Specifically, the processing unit 50 obtains the open circuit voltage of the secondary battery 200 measured by the voltage detecting unit 20 via the ADC 40 (step S10). Also, the processing unit 50 obtains the temperature of the secondary battery 200 measured by the temperature detecting unit 10 via the ADC 40 (step S20).

Then, the processing unit 50 calculates a corresponding charge rate for the open circuit voltage obtained in step S10 as a pre-temperature-corrected charge rate of the secondary battery 200 based on characteristics data representing the open circuit voltage-charge rate characteristics of FIG. 2 that are stored in the memory 60 (step S30). It is noted that the temperature characteristics of the open circuit voltage of the secondary battery 200 are not taken into consideration in the calculation step S30.

Then, the processing unit 50 obtains a temperature-corrected open circuit voltage by correcting the open circuit voltage obtained in step S10 according to the temperature obtained in step S20 and the charge rate calculated in step S30 based on the characteristics data representing the open circuit voltage-temperature characteristics of FIG. 3 that are stored in the memory 60 (step S40).

In one preferred embodiment, a curve fitting process may be performed in the manner described above so that the open circuit voltage-temperature characteristics of FIG. 3 may be expressed as an approximate function with the temperature and the charge rate as variables, and a corrected open circuit voltage or an offset amount of the corrected open circuit voltage reflecting the temperature characteristics of the open circuit voltage of the secondary battery 200 may be calculated based on the approximate function.

Then, the processing unit 50 obtains a temperature-corrected charge rate corresponding to the temperature-corrected open circuit voltage obtained in step S40 based on the characteristics data representing the open circuit voltage-charge rate characteristics of FIG. 2 that are stored in the memory 60 (step S50). In this way, a temperature-corrected charge rate reflecting the temperature characteristics of the open circuit voltage of the secondary battery 200 may be obtained. Also, in one preferred embodiment, the above-described process steps may be repetitively performed to obtain an even more accurately corrected charge rate of the secondary battery 200.

Figure 9:
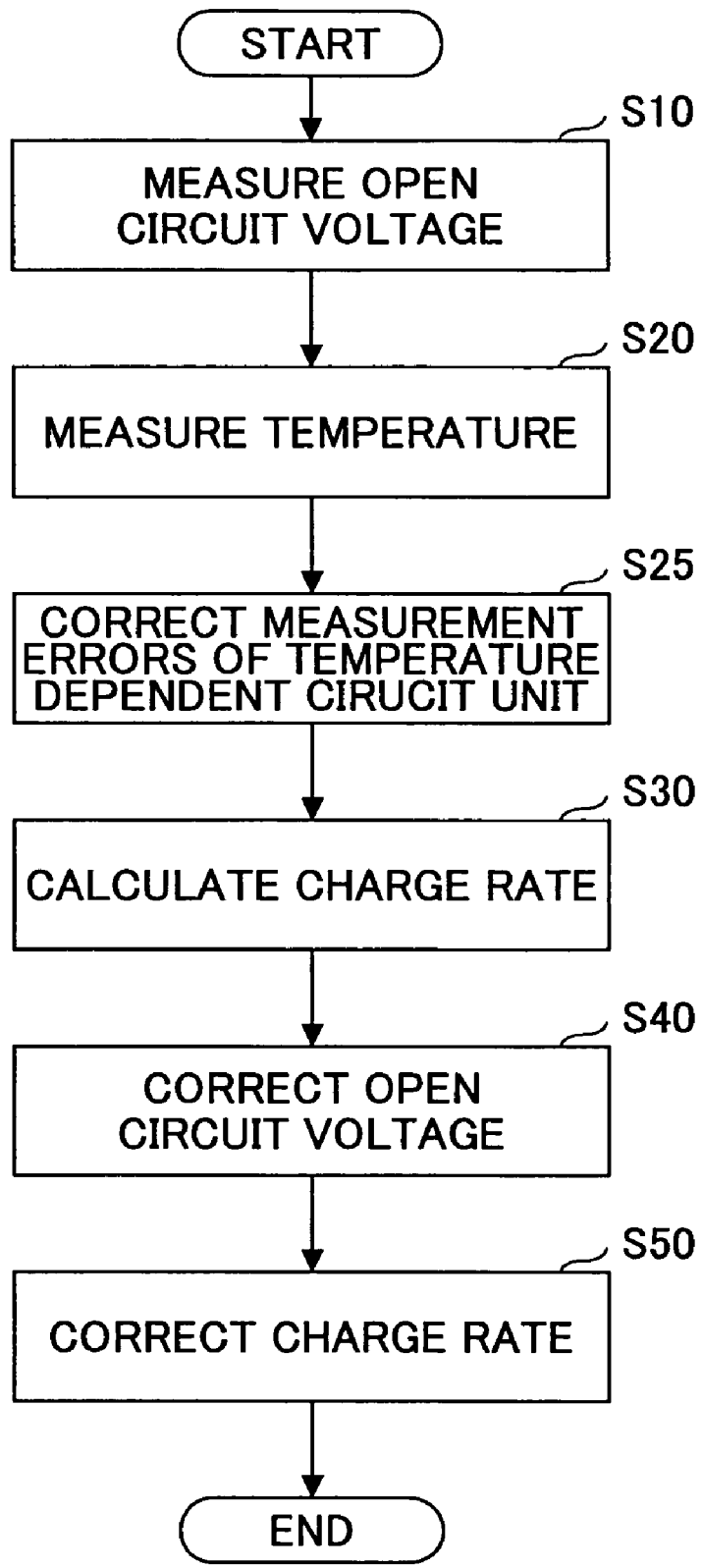
FIG. 9 is a flowchart showing process steps of a correction process for calculating/correcting the charge rate of the secondary battery taking into consideration the temperature characteristics of the open circuit voltage of the secondary battery and the temperature characteristics of the temperature dependent circuit unit.

FIG. 9 is a flowchart showing process steps of a correction process for calculating/correcting the charge rate of the secondary battery 200 taking into consideration the temperature characteristics of the open circuit voltage of the secondary battery 200 and the temperature characteristics of a temperature dependent circuit unit (i.e., ADC 40 in the present example) of the battery status detecting apparatus 100. In this case, the processing unit 50 calculates/corrects the charge rate of the secondary battery 200 by correcting the open circuit voltage of the secondary battery 200 measured by the voltage detecting unit 20 according to the temperature measured by the temperature detecting unit 10 based on the open circuit voltage-charge rate characteristics shown in FIG. 2, the open circuit voltage-temperature characteristics shown in FIG. 3, and the temperature characteristics of the ADC 40 shown in FIG. 7. It is noted that the process steps of FIG. 9 that are substantially identical to the process steps of FIG. 8 are given the same reference numbers and their descriptions are omitted.

In the correction process of FIG. 9, steps S10 and S20 for measuring the open circuit voltage and the temperature are performed in a manner identical to steps S10 and S20 of the correction process of FIG. 8. Then, the processing unit 50 corrects the measured open circuit voltage obtained via the ADC 40 in step S10 according to the temperature detected in step S20 based on characteristics data representing the temperature characteristics of the ADC 40 (FIG. 7) that are stored in the memory 60 (step S25). For example, the processing unit 50 may calculate a measurement-corrected value of the measured open circuit voltage value obtained via the ADC 40 in step S10 according to the temperature measured in step S20 and the formula (3) reflecting the coefficient values A, B, and C that are stored in the memory 60. In this way, measurement errors occurring due to temperature characteristics of the ADC 40 may be removed.

Then, the processing unit 50 calculates a corresponding charge rate (pre-temperature-corrected charge rate) for the measurement-corrected value of the open circuit voltage obtained in step S25 based on the characteristics data representing the open circuit voltage-charge rate characteristics of FIG. 2 that are stored in the memory 60 (step S30). It is noted that although temperature characteristics of the ADC 40 are reflected in the charge rate calculated in step S30, the temperature characteristics of the open circuit voltage of the secondary battery 200 are not reflected in the charge rate calculated in step S30.

Then, the processing unit 50 obtains a temperature-corrected open circuit voltage by further correcting the measurement-corrected value of the open circuit voltage obtained in step S25 according to the temperature detected in step S20 and the charge rate calculated in step S30 based on the characteristics data representing the open circuit voltage-temperature characteristics of FIG. 3 that are stored in the memory 60 (step S40).

Then, the processing unit 50 calculates a temperature-corrected charge rate corresponding to the temperature-corrected open circuit voltage obtained in step S40 based on the characteristics data representing the open circuit voltage-charge rate characteristics of FIG. 2 that are stored in the memory 60 (step S50). In this way, a temperature-corrected charge rate of the secondary battery 200 may be calculated taking temperature characteristics of the open circuit voltage of the secondary battery 200 and the temperature characteristics of the ADC 40 into consideration. In one preferred embodiment, the above-described process steps may be repetitively performed to obtain an even more accurate charge rate calculation result.

As can be appreciated from the above description, in the above-described embodiments of the present invention, the temperature characteristics are taken into consideration in detecting the battery status so that an accurate battery status detection may be performed.

According to an aspect of the present invention, the open circuit voltage of a secondary battery (or the voltage when the current flow status of the secondary battery is determined to be close to an open circuit status) and the temperature of the secondary battery including the ambient temperature are measured, a temperature-corrected voltage value is calculated based on the open circuit voltage-temperature characteristics of the secondary battery that are obtained beforehand, and the current charge rate of the secondary battery is calculated based on the temperature-corrected voltage value and the open circuit voltage-charge rate characteristics of the secondary battery that are obtained beforehand. In this way, the current charge rate of the secondary battery may be accurately estimated taking the temperature into consideration.

It is noted that when a secondary battery can be used under a relatively wide range of temperatures (e.g., a lithium ion battery may be used under temperatures ranging from approximately −20° C. through 60° C.) and temperature dependent circuit units, such as a reference voltage generating circuit or an oscillation circuit, exist within a measuring system for measuring a status of the secondary battery, measurement errors of the measuring system may have a significant influence on the battery status detection accuracy. Accordingly, in such a case, a measurement error correction may be performed taking the temperature characteristics of the measuring system into consideration in order to reduce the influence of the measurement errors.

According to another aspect of the present invention, because the open circuit voltage and the charge rate of a secondary battery may be accurately calculated by taking temperature characteristics into consideration, the detection accuracy of the other battery statuses, such as the full charge capacity or the degree of degradation of the secondary battery, may be improved as well.

Further, it is noted that the present invention is not limited to the specific embodiments described above, and variations and modifications may be made without departing from the scope of the present invention.

The present application is based on and claims the benefit of the earlier filing date of Japanese Patent Application No. 2007-197863 filed on Jul. 30, 2007, the entire contents of which are hereby incorporated by reference.

What is claimed is:

1. A battery status detecting method for detecting a battery status of a secondary battery, the method comprising:
an open circuit voltage measuring step of measuring an open circuit voltage of the secondary battery by a voltage detecting unit using an output value of a temperature-dependent circuit unit;
a charge rate calculating step of calculating a charge rate of the secondary battery based on charge rate characteristics indicating a relationship between the open circuit voltage and the charge rate of the secondary battery;
an open circuit voltage correcting step of obtaining a temperature-corrected value of the open circuit voltage of the secondary battery according to a temperature of the secondary battery, based on first temperature characteristics indicating a relationship between the open circuit voltage and the temperature of the secondary battery;
a charge rate correcting step of obtaining a temperature-corrected value of the charge rate of the secondary battery according to the temperature-corrected value of the open circuit voltage obtained in the open circuit voltage correcting step, based on the charge rate characteristics indicating the relationship between the open circuit voltage and the charge rate of the secondary battery; and
a measured voltage correcting step of obtaining a temperature-corrected value of the measured open circuit voltage by correcting the measured open circuit voltage according to the temperature of the secondary battery based on second temperature characteristics of the temperature-dependent circuit unit indicating a relationship between input/output temperature characteristics of the temperature-dependent circuit unit and the temperature of the secondary battery,
wherein the second temperature characteristics of the temperature-dependent circuit unit are represented by an approximated curve of a quadratic function formula of an output value of the temperature-dependent circuit unit, the quadratic function formula including the temperature as a variable and the output value of the temperature-dependent circuit unit as a quadratic function of the variable, and
computing the temperature-corrected value of the measured open circuit voltage, at the measured voltage correcting step, based the temperature of the secondary battery and predetermined values of coefficients included in the quadratic function formula.

2. The battery status detecting method as claimed in claim 1, further comprising: a temperature measuring step of measuring a temperature of the secondary battery by a temperature detecting unit via the temperature-dependent circuit unit.

3. The battery status detecting method as claimed in claim 1, wherein:
the open circuit voltage correcting step includes correcting the measured open circuit voltage according to the temperature of the secondary battery based on the second temperature characteristics.

4. The battery status detecting method as claimed in claim 2, wherein:
the open circuit voltage correcting step includes correcting the measured open circuit voltage according to the temperature measured in the temperature measuring step, based on the second temperature characteristics.

5. A battery status detecting apparatus that detects a battery status of a secondary battery, the apparatus comprising:
an open circuit voltage measuring unit to measure an open circuit voltage of the secondary battery by a voltage detecting unit using an output value of a temperature dependent circuit unit;
a charge rate calculating unit to calculate a charge rate of the secondary battery based on charge rate characteristics indicating a relationship between the open circuit voltage and the charge rate of the secondary battery; and a correction unit to obtain a temperature-corrected value of the open circuit voltage of the secondary battery according to a temperature of the secondary battery based on first temperature characteristics indicating a relationship between the open circuit voltage and the temperature of the secondary battery, and to obtain a temperature-corrected value of the charge rate of the secondary battery according to the temperature-corrected value of the open circuit voltage based on the charge rate characteristics indicating the relationship between the open circuit voltage and the charge rate of the secondary battery, wherein the correction unit is further configured to obtain a temperature-corrected value of the measured open circuit voltage of the secondary battery by correcting the measured open circuit voltage according to the temperature of the secondary battery, based on second temperature characteristics of the temperature-dependent circuit unit indicating a relationship between input/output temperature characteristics of the temperature-dependent circuit unit and the temperature of the secondary battery, wherein the second temperature characteristics of the temperature-dependent circuit unit are represented by an approximated curve of a quadratic function formula of an output value of the temperature-dependent circuit unit, the quadratic function formula including the temperature as a variable and the output value of the temperature-dependent circuit unit as a quadratic function of the variable, and the correction unit is configured to compute the temperature-corrected value of the measured open circuit voltage based the temperature of the secondary battery and predetermined values of coefficients included in the quadratic function formula.

6. The battery status detecting apparatus as claimed in claim 5, further comprising:

a temperature measuring unit to measure a temperature of the secondary battery by using the temperature-dependent circuit unit.

7. The battery status detecting apparatus as claimed in claim 6, comprising:

an integrated circuit that integrates the open circuit voltage measuring unit and the temperature measuring unit.

* * * * *